(12) United States Patent
Kobayashi et al.

(10) Patent No.: US 7,833,912 B2
(45) Date of Patent: Nov. 16, 2010

(54) SEMICONDUCTOR DEVICE AND METHOD OF MANUFACTURING THE SAME

(75) Inventors: Takayo Kobayashi, Yokohama (JP); Tomohiro Oki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 424 days.

(21) Appl. No.: 11/790,722

(22) Filed: Apr. 27, 2007

(65) Prior Publication Data
US 2007/0254463 A1    Nov. 1, 2007

(30) Foreign Application Priority Data
Apr. 28, 2006 (JP) ............................. 2006-127043

(51) Int. Cl.
*H01L 21/302* (2006.01)
(52) U.S. Cl. ...................... 438/748; 430/327
(58) Field of Classification Search ................ 438/748, 438/745, 747; 427/240; 430/327
See application file for complete search history.

(56) References Cited

U.S. PATENT DOCUMENTS

| 4,510,176 | A | * | 4/1985 | Cuthbert et al. | ............. 438/780 |
|---|---|---|---|---|---|
| 5,323,049 | A | * | 6/1994 | Motonami | ................... 257/401 |
| 5,618,380 | A | * | 4/1997 | Siems et al. | ................... 438/14 |
| 5,879,577 | A | | 3/1999 | Weng et al. | |
| 6,140,254 | A | | 10/2000 | Endisch et al. | |
| 6,573,027 | B1 | * | 6/2003 | Imai | ........................... 430/311 |
| 2005/0202346 | A1 | * | 9/2005 | Yamano | ..................... 430/300 |
| 2006/0003591 | A1 | | 1/2006 | Cheng et al. | |

FOREIGN PATENT DOCUMENTS

| JP | 6-275613 | 9/1994 |
|---|---|---|
| JP | 7-297492 | 11/1995 |
| JP | 11-68067 | 3/1999 |

\* cited by examiner

*Primary Examiner*—Charles D Garber
*Assistant Examiner*—Reema Patel
(74) *Attorney, Agent, or Firm*—Finnegan, Henderson, Farabow, Garrett & Dunner, L.L.P.

(57) ABSTRACT

According to an aspect of the present invention, there is provided a semiconductor device including a semiconductor substrate which includes a number of chip areas, a processed film which is formed on the semiconductor substrate, and a ring-shaped pattern which is formed on the processed film and along a peripheral portion of the semiconductor substrate.

11 Claims, 4 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-127043, filed Apr. 28, 2006, the entire contents of which are incorporated herein by reference.

BACKGROUND OF THE INVENTION

1. Field of the Invention

The present invention relates to a lithography process, which is one process of manufacturing a semiconductor device. In particular, the present invention relates to a semiconductor device in which exposure of interconnects is carried out over the entire surface, and a method of manufacturing the same.

2. Description of the Related Art

Conventionally, in a process of manufacturing a semiconductor device, the entire surface of a wafer is exposed in a lithography process to make uniform the characteristic of the wafer surface (hereinafter, referred to as an entire surface shot). The foregoing entire surface shot has the following problem. As shown in FIG. 5, a chip T has a portion in which a chipped pattern (hereinafter, referred to as a defective chip portion) is generated. The chip T ranges over a portion on the periphery of a wafer S in which the resist is removed (hereinafter, referred to as a peripheral cut portion). In the lithography process of interconnections, the pattern scatters from the defective chip portion, resulting in a failure due to dust. In FIG. 5, there is shown an enlarged image A of the chip T.

Jpn. Pat. Appln. KOKAI Publication No. 6-275613 discloses the following technique. According to the technique, a step in an interconnection forming portion is reduced, and the film thickness of a resist pattern is prevented from being locally varied when interconnection patterns are formed. In this way, disconnection and pattern collapse are prevented. Moreover, Jpn. Pat. Appln. KOKAI Publication No. 7-297492 discloses the following technique. According to the technique, a substrate surface is processed into a concavo-convex shape periodically and smoothly changing. Thereafter, in the multi-layer process, the concavo-convex shape is hard to collapse; therefore, this serves to prevent resist pattern collapse. Moreover, Jpn. Pat. Appln. KOKAI Publication No. 11-68067 discloses the following technique. According to the technique, a plug connected with a lower layer interconnection through a contact hole or via hole formed in an interlayer insulating film is formed. Etching is carried out so that the upper surface of the interlayer insulating film becomes lower than the upper surface of the plug to leave the interlayer insulating film. In this way, pattern collapse is prevented.

BRIEF SUMMARY OF THE INVENTION

According to an aspect of the present invention, there is provided a semiconductor device, comprising: a semiconductor substrate which includes a number of chip areas; a processed film which is formed on the semiconductor substrate; and a ring-shaped pattern which is formed on the processed film and along a peripheral portion of the semiconductor substrate.

According to another aspect of the present invention, there is provided a method of manufacturing a semiconductor device, comprising: forming a film to be processed on a semiconductor substrate; coating a resist on the entire surface of the film; ejecting solvent to a peripheral portion of the semiconductor substrate to remove the resist on the peripheral portion, and forming a portion having a predetermined width and an increased film thickness in the resist inside the peripheral portion; and removing the resist outside the portion of the resist having the increased film thickness.

According to another aspect of the present invention, there is provided a method of manufacturing a semiconductor device, comprising: forming a film to be processed on a semiconductor substrate; coating a resist on the entire surface of the film; exposing the resist via a light-shielding band arranged above the semiconductor substrate, and thereby, forming a non-exposed portion of the resist having a predetermined width inside a peripheral portion of the semiconductor substrate.

DETAILED DESCRIPTION OF THE INVENTION

Embodiments of the present invention will be hereinafter described with reference to the accompanying drawings.

According to the first embodiment, the following structure is provided in order to prevent a pattern from scattering in the defective chip portion of the peripheral cut portion of the wafer. According to the structure, a ring-shaped portion of a resist (processed film) in which no pattern is formed is left in the peripheral cut portion. The ring-shaped portion having no pattern is formed along the peripheral cut portion to link with the outermost peripheral portion of the defective pattern generated in each defective chip portion. The width of the ring is set to not less than the width of the minimum isolated line of a device to be formed. Note that the defective chip is a chip in which all patterns are not formed due to a peripheral cut. The defective pattern is a pattern in which all patterns are not formed due to a peripheral cut in the defective chip.

Figure 1:
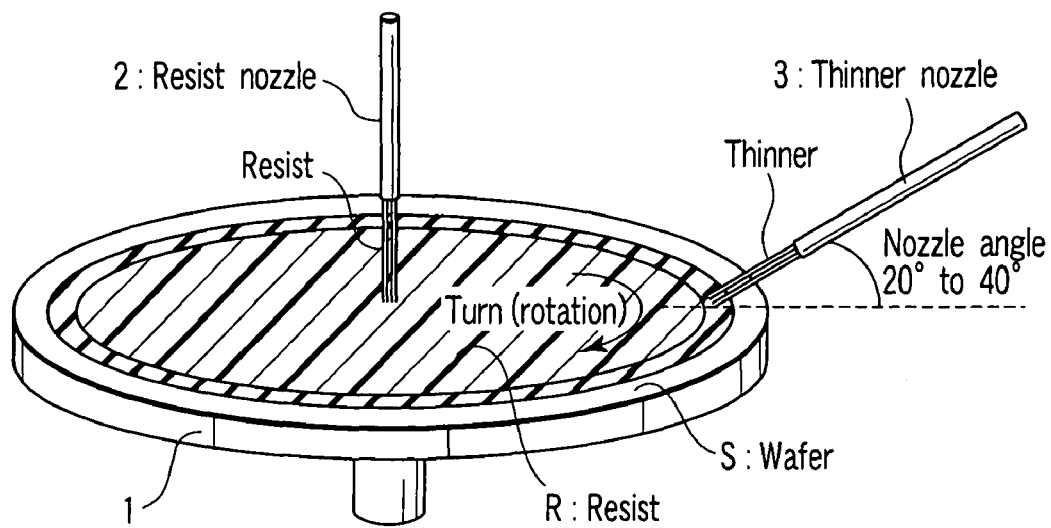
FIG. 1 is a perspective view to explain a method of manufacturing a semiconductor device according to a first embodiment.

FIG. 1 is a perspective view to explain a method of manufacturing a semiconductor device according to the first embodiment. Hereinafter, a method of forming a ring-shaped portion having no pattern on a wafer will be explained with reference to FIG. 1.

In FIG. 1, a film (not shown) to be etched is formed on a circular wafer S having a number of chip areas. A positive photoresist R is coated onto the entire surface of the film. The wafer S is placed on a turntable 1. A resist nozzle 2 is arranged above the center portion of the turntable 1. A thinner nozzle 3 is arranged above the peripheral portion of the turntable 1 in a state of being inclined.

Resist is dropped from the resist nozzle 2 above the wafer S turning together with the turntable 1 with respect to the film to be etched. In this way, the film is coated with resist R.

Simultaneously, thinner (solvent) is ejected from the thinner nozzle 3 onto the peripheral portion of the wafer S. In this way, the resist on the peripheral portion of the wafer S is removed so that the resist having film thickness described later is formed into a ring shape. The following method is employed in order to eject thinner. Specifically, the thinner nozzle 2 is set at an angle of 20° to 40° to the horizontal plane (wafer surface), and the eject amount of the thinner is set to 0.3 to 0.7 l (liter)/min.

Figure 2:
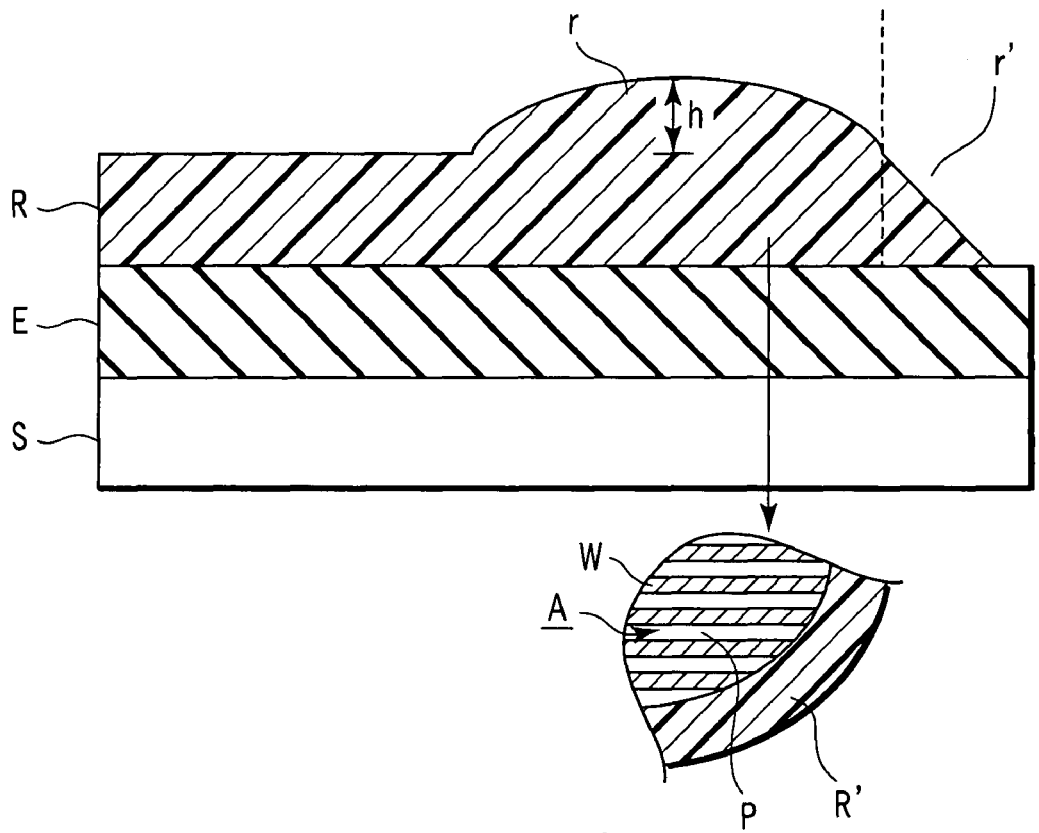
FIG. 2 is a cross-sectional view showing the peripheral portion of a wafer S according to the first embodiment.

FIG. 2 is a cross-sectional view showing the peripheral portion of the wafer S. In the lithography process using the foregoing positive resist, when the periphery of the resist on the wafer S is cut, the peripheral portion of the resist R on the film E to be etched is removed using thinner. In this process, the ejection angle and flow rate of thinner are optimized as described above, and thereby, a ring-shaped resist-raised portion r is formed.

The height h, that is, the thickness of the ring-shaped raised portion (the increased film thickness) is set not less than the depth of focus (DOF) required for the corresponding lithography process. The width of the raised portion is set not less than the width of the minimum isolated line under the design rule of a device to be formed. Note that a resist r' is located outside the raised portion r of the resist formed by the thinner process, and is thinner than the DOF. The resist r' is removed in a development process after exposure is carried out along the peripheral portion of the wafer S.

Next, exposure is carried out to transfer a pattern to the wafer S using a mask. The exposure is generally carried out using an entire surface shot. However, since the resist portion formed with the foregoing raised portion r is thick, there is left a resist without being resolved. The resist is formed into a ring shape along the peripheral portion of the wafer S. The resists of the exposed portion of the peripheral portion of the wafer S and the exposed portion using a mask are removed via development.

In this way, as seen from A of FIG. 2, each interconnection (wiring) W is linked with a ring-shaped left resist R' (the portion of the resist having no pattern) in the outermost peripheral portion of the defective pattern (the pattern having a chipped portion) p of the defective chip portion. After processing, a processed resist film is left like a ring. Therefore, there is no scattering of the pattern, which is a factor in producing dust.

Figure 3:
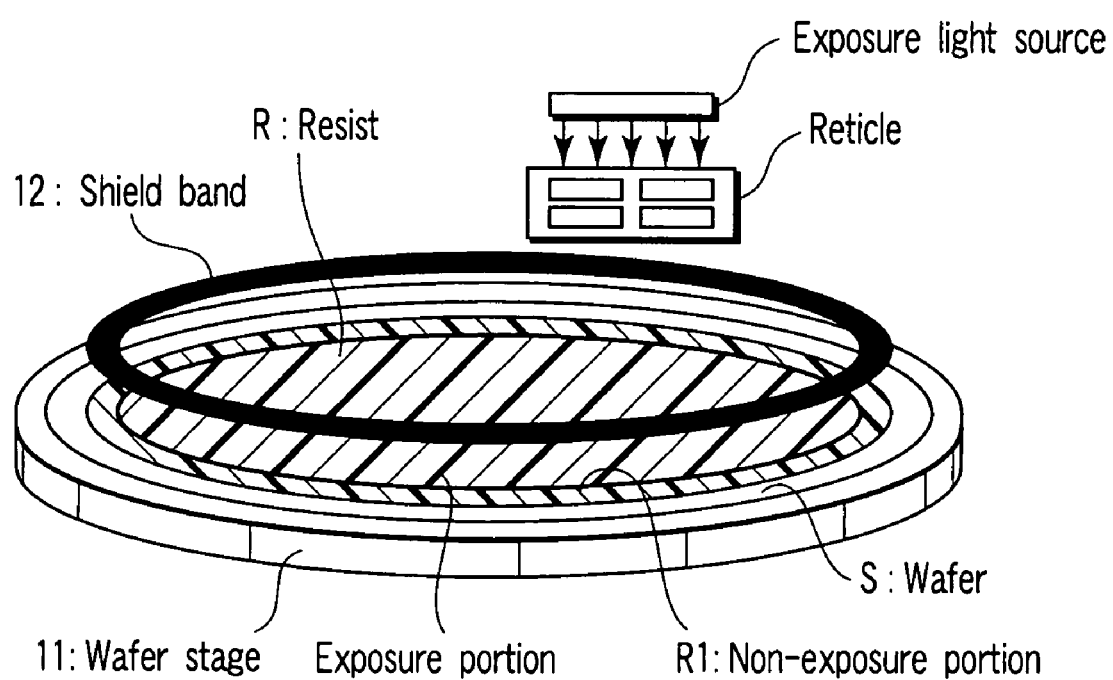
FIG. 3 is a perspective view to explain a method of manufacturing a semiconductor device according to a second embodiment.

FIG. 3 is a perspective view to explain a method of manufacturing a semiconductor device according to a second embodiment. Hereinafter, a method of forming a ring-shaped portion having no pattern on a wafer will be explained with reference to FIG. 3.

In FIG. 3, a wafer S is coated with a positive photoresist R over its entire surface. The wafer S is placed on a wafer stage 11 in an exposure apparatus. A ring-shaped light-shielding band 12 is arranged above the wafer S in a state that it does not contact with the wafer.

The wafer S coated wit the positive resist R proceeds to an exposure process for forming a pattern in the exposure apparatus. According to the structure shown in FIG. 3, the light-shielding band 12 arranged above the peripheral portion of the wafer S shields light irradiated from above in a ring shape during the exposure process. In this way, a non-exposed portion R1 of the ring-shaped resist R is formed. Note that the exposure is carried out in a state that the light-shielding band 12 is moved in conjunction with the wafer stage 11.

Figure 4A:
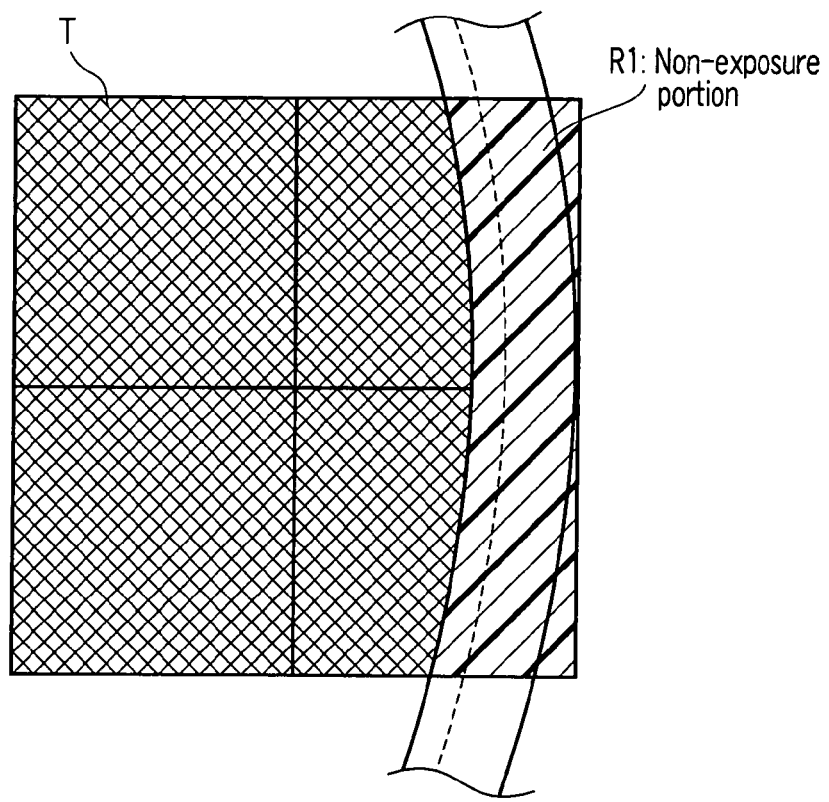
FIG. 4A and FIG. 4B are views showing a non-exposure portion on a cut chip formed using a light-shielding band according to the second embodiment.

FIG. 4A shows the non-exposed portion R1 on the defective chip portion T formed using the light-shielding band 12.

Figure 4B:
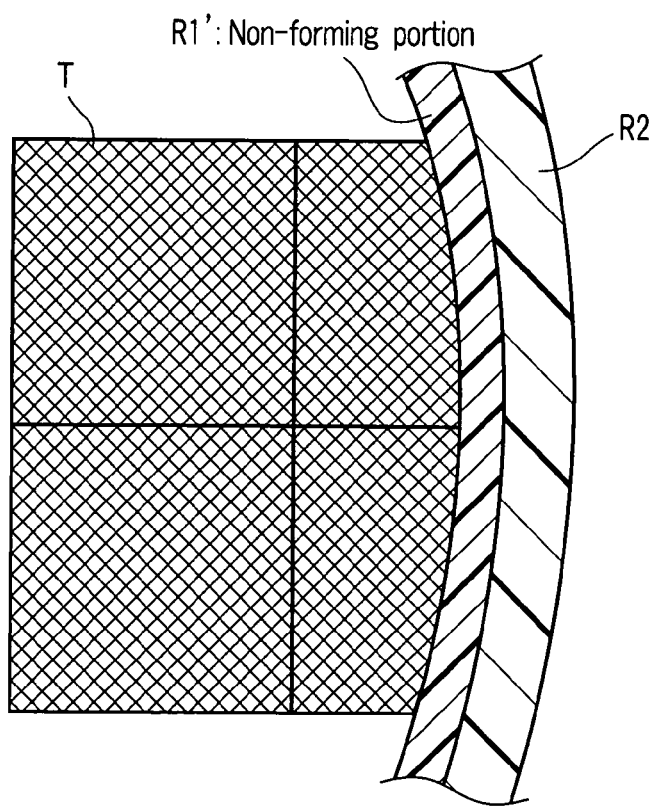
Figure 5:
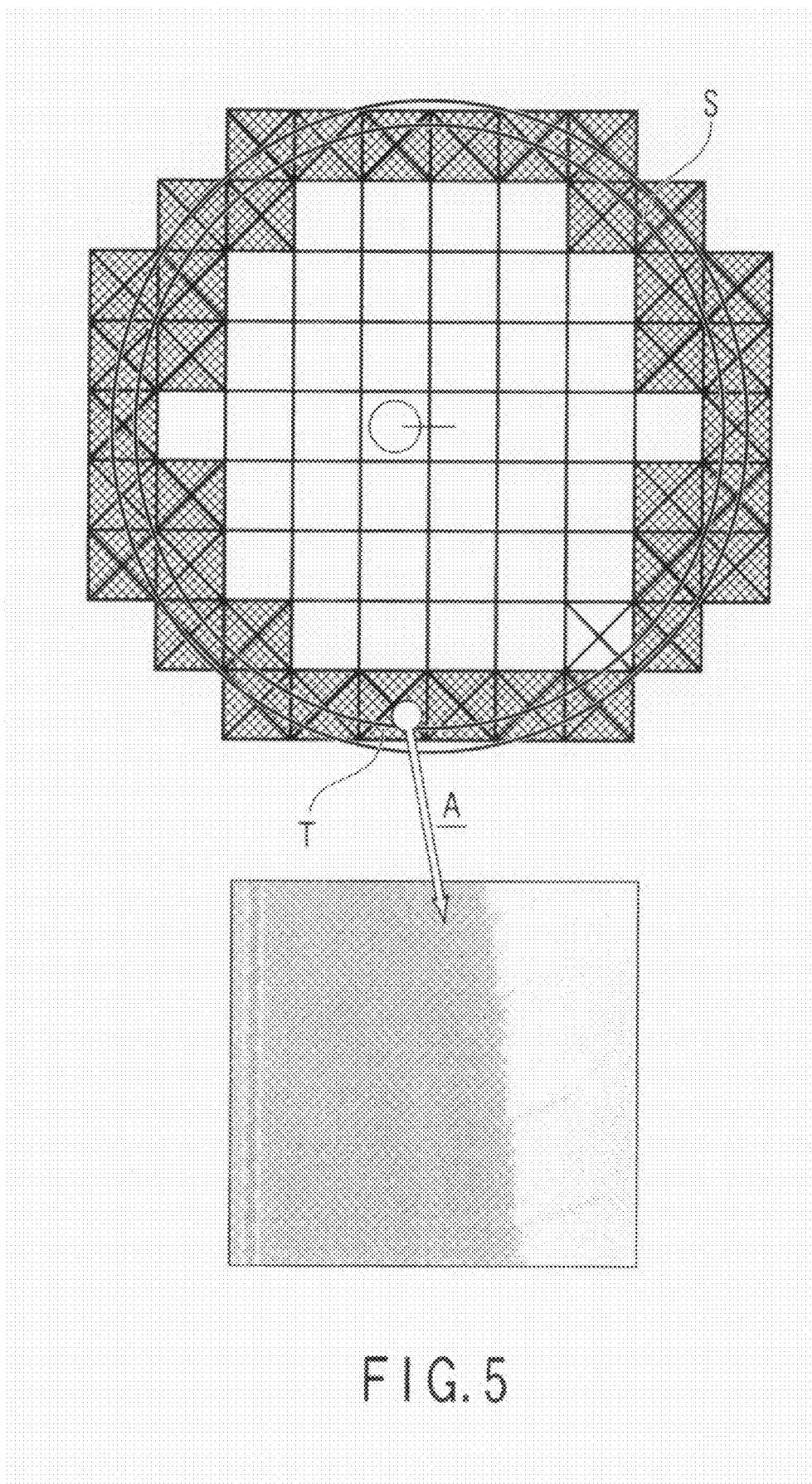
FIG. 5 is a view showing a wafer exposed state according to the prior art, and shows a partially enlarged image.

As shown in FIG. 4B, of the non-exposed portion R1, a portion R2 except a pattern non-formed portion R1' is removed by peripheral exposure. The pattern non-formed portion R1' has a width not less than the width of the minimum isolated line of a device to be formed.

In the lithography process using a positive resist, when the entire surface shot is carried out with respect to the wafer S, the following exposure mechanism is used. The exposure mechanism includes the light-shielding band 12, which changes along the curvature of the edge cut portion of the resist R. In this way, the ring-shaped non-exposed portion R1 of the resist having a predetermined width and thickness is formed inside the peripheral cut portion of the resist along the wafer S. In this case, the defective pattern of the defective chip portion is connected to the left ring-shaped pattern non-formed portion R1'. After exposure, a ring-shaped lower-layer film of the resist is left. Therefore, there is no pattern scattering, which is a factor in producing dust.

According to the above embodiments, in the process of manufacturing a semiconductor device, exposure in the lithography process is carried out with respect to the entire surface of the wafer. In this case, it is possible to prevent pattern scattering produced in the defective chip portion ranging the peripheral cut portion of the resist in the peripheral portion of the wafer.

According to the semiconductor device and the method of manufacturing the same of the embodiments, pattern scattering produced in the defective chip portion ranging the peripheral cut portion of a semiconductor substrate can be prevented. Moreover, it is possible to prevent the reduction of the yield resulting from a failure due to dust.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a film to be processed on a semiconductor substrate;
    coating a resist on the entire surface of the film;
    ejecting solvent to a peripheral portion of the semiconductor substrate to form a portion having a predetermined width and an increased film thickness in the resist inside the peripheral portion; and
    removing the resist outside the portion of the resist to leave the portion having the increased film thickness.

2. The method according to claim 1, wherein the portion having the increased film thickness has a ring shape.

3. The method according to claim 1, wherein the portion having the increased film thickness has a thickness of not less than a depth of focus required for a lithography process.

4. The method according to claim 1, wherein the predetermined width is not less than a width of a minimum isolated line to be formed.

5. The method according to claim 1, wherein the resist outside the portion of the resist having the increased film thickness is removed by development.

6. The method according to claim 1, wherein the solvent is ejected to the surface of the semiconductor substrate at an angle of 20° to 40°.

7. The method according to claim 1, wherein the eject amount of the solvent is 0.3 to 0.7 l/min.

8. A method of manufacturing a semiconductor device, comprising:
- forming a film to be processed on a semiconductor substrate;
- coating a resist on the entire surface of the film;
- exposing the resist via a ring-shaped light-shielding band arranged only above a peripheral portion of the semiconductor substrate to form a non-exposed portion of the resist having a predetermined width within the peripheral portion of the semiconductor substrate.

9. The method according to claim 8, wherein the non-exposed portion has a ring shape.

10. The method according to claim 8, wherein the predetermined width is not less than a width of a minimum isolated line to be formed.

11. The method according to claim 8, wherein the light-shielding band changes along a curvature of an edge cut portion of the resist.

* * * * *